(12) United States Patent
Kojima et al.

(10) Patent No.: US 10,120,132 B2
(45) Date of Patent: Nov. 6, 2018

(54) PHOTONIC INTEGRATED CIRCUIT

(71) Applicant: Mitsubishi Electric Research Laboratories, Inc., Cambridge, MA (US)

(72) Inventors: Keisuke Kojima, Weston, MA (US); Satoshi Nishikawa, Tokyo (JP); Toshiaki Koike-Akino, Malden, MA (US); Bingnan Wang, Belmont, MA (US); Eiji Yagyu, Tokyo (JP)

(73) Assignees: Mitsubishi Electric Research Laboratories, Inc., Cambridge, MA (US); Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/473,752

(22) Filed: Mar. 30, 2017

(65) Prior Publication Data

US 2018/0284345 A1    Oct. 4, 2018

(51) Int. Cl.
*G02B 6/125* (2006.01)
*G02B 6/293* (2006.01)
*G02B 6/42* (2006.01)
*H01L 23/38* (2006.01)
*H01L 23/367* (2006.01)
(Continued)

(52) U.S. Cl.
CPC .............. *G02B 6/125* (2013.01); *G02B 6/293* (2013.01); *G02B 6/30* (2013.01); *G02B 6/4257* (2013.01); *G02B 6/4269* (2013.01); *H01L 23/3672* (2013.01); *H01L 23/38* (2013.01); *G02B 2006/12135* (2013.01)

(58) Field of Classification Search
None
See application file for complete search history.

(56) References Cited

U.S. PATENT DOCUMENTS 6,411,752 B1    6/2002   Little et al.
6,823,110 B2   11/2004   Battiato et al.
(Continued)

OTHER PUBLICATIONS

Watanabe et al. "Trimming of InP-based Mach-Zehnder interferometer by filling side cladding of high-mesa waveguide with resin ," in Electron. Lett, vol. 47, No. 22, 2011.

*Primary Examiner* — Jerry Rahll
(74) *Attorney, Agent, or Firm* — Gennadiy Vinokur; James Mcaleenan; Hironori Tsukamoto

(57) ABSTRACT

A photonic integrated circuit having discrete optical components arranged on a top side of a substrate includes a first and second optical sources respectively configured to emit light beams, a first interferometer having a first and second input ports respectively coupled to the first and second optical sources via first waveguides, a second interferometer configured to receive signals from the first interferometer via second waveguides and combine the signals to transmit a combined signal via a third waveguide, and a submount configured to contact a back side of the substrate, wherein the submount includes a first thermal conductor having a first thermal conductivity and a second conductor having a second thermal conductivity, wherein the first thermal conductivity is greater than the second thermal conductivity, and the first and second optical sources are more proximity to the first thermal conductor than the second thermal conductor.

17 Claims, 16 Drawing Sheets

(51) Int. Cl.
  *G02B 6/30*  (2006.01)
  *G02B 6/12*  (2006.01)

(56) References Cited

U.S. PATENT DOCUMENTS 7,885,492 B2    2/2011   Welch et al.
8,285,150 B2 *  10/2012  Bai .................... H04J 14/02
                                                398/142

* cited by examiner

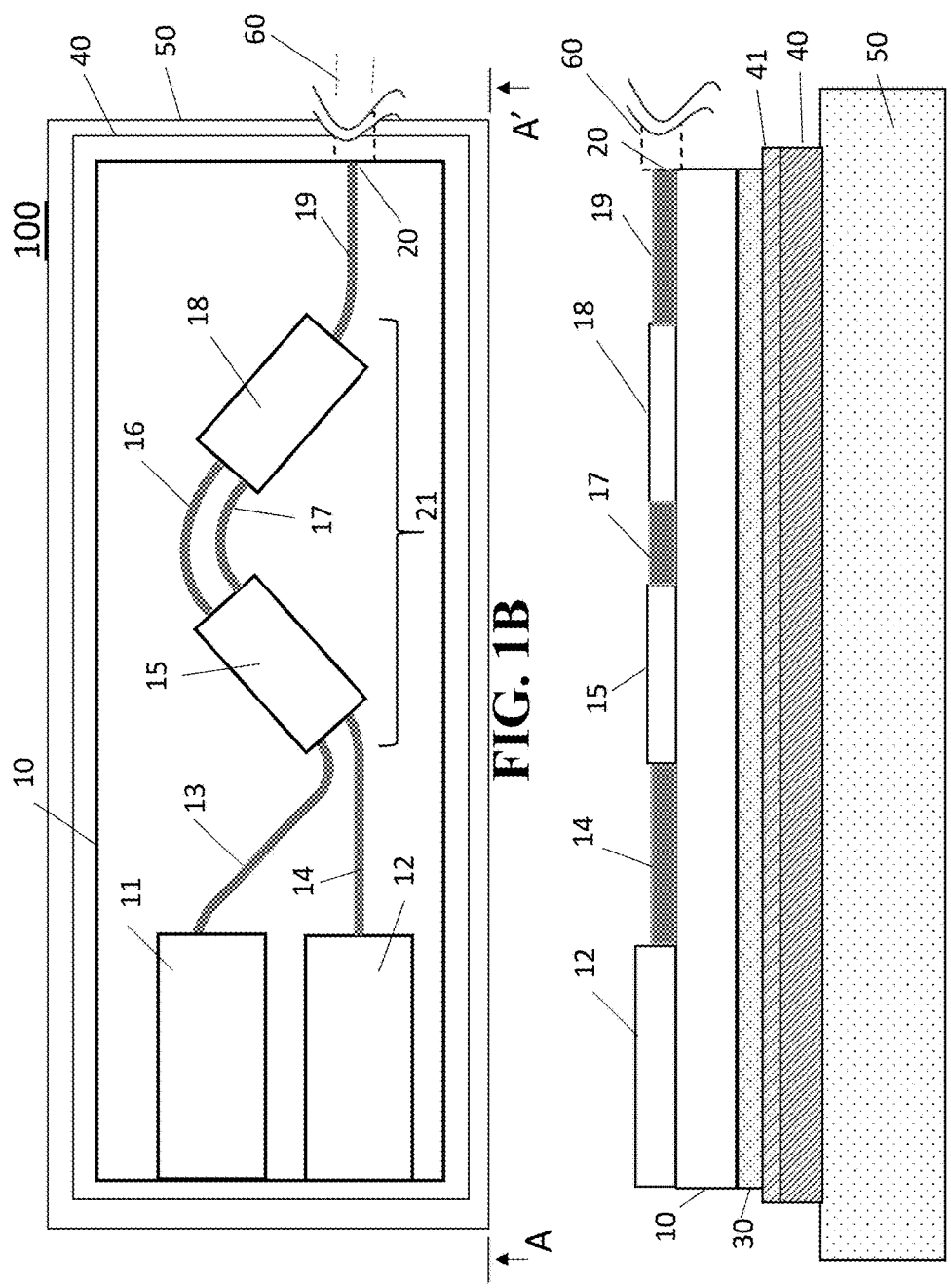

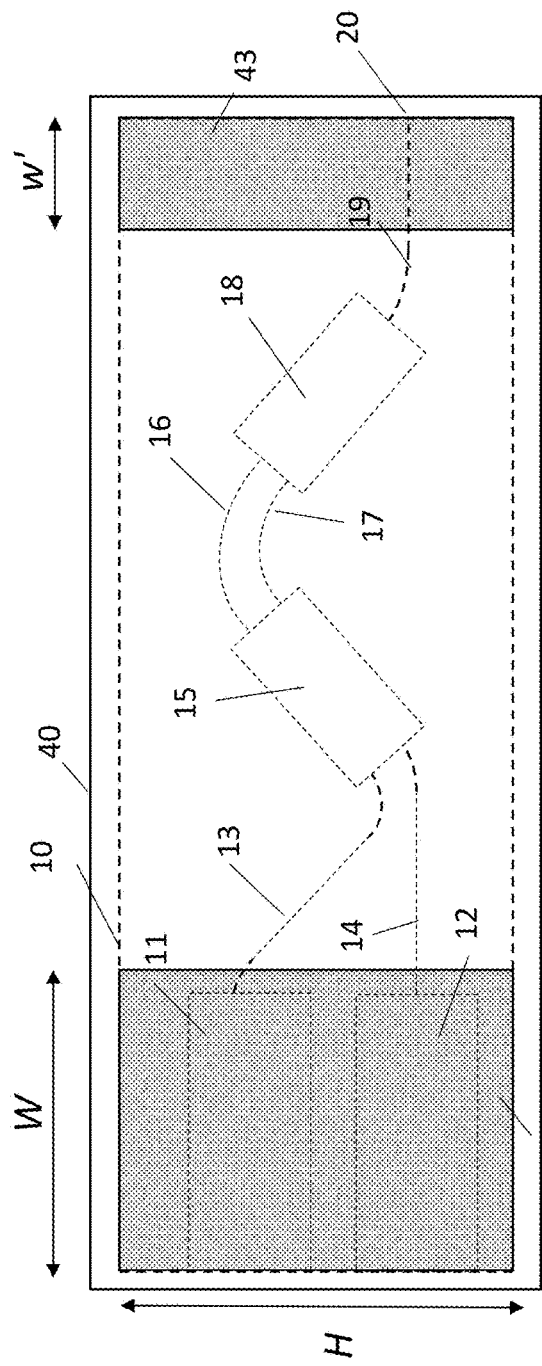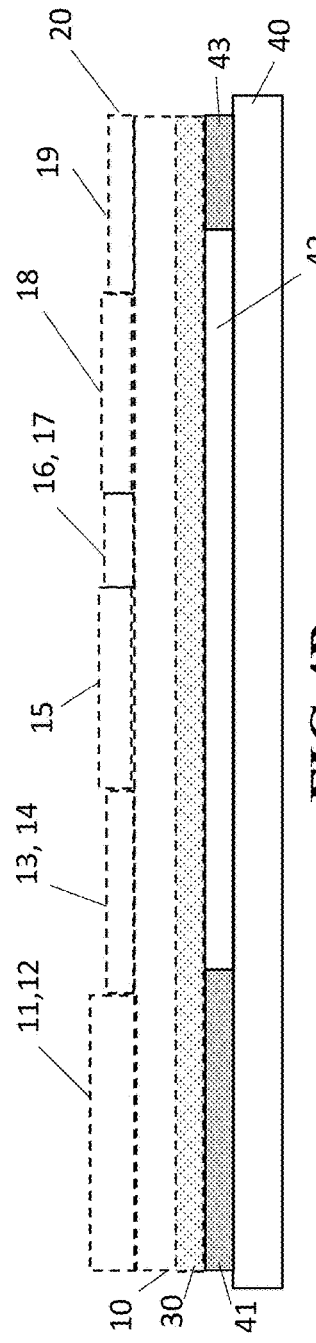
FIG.4A
FIG.4B

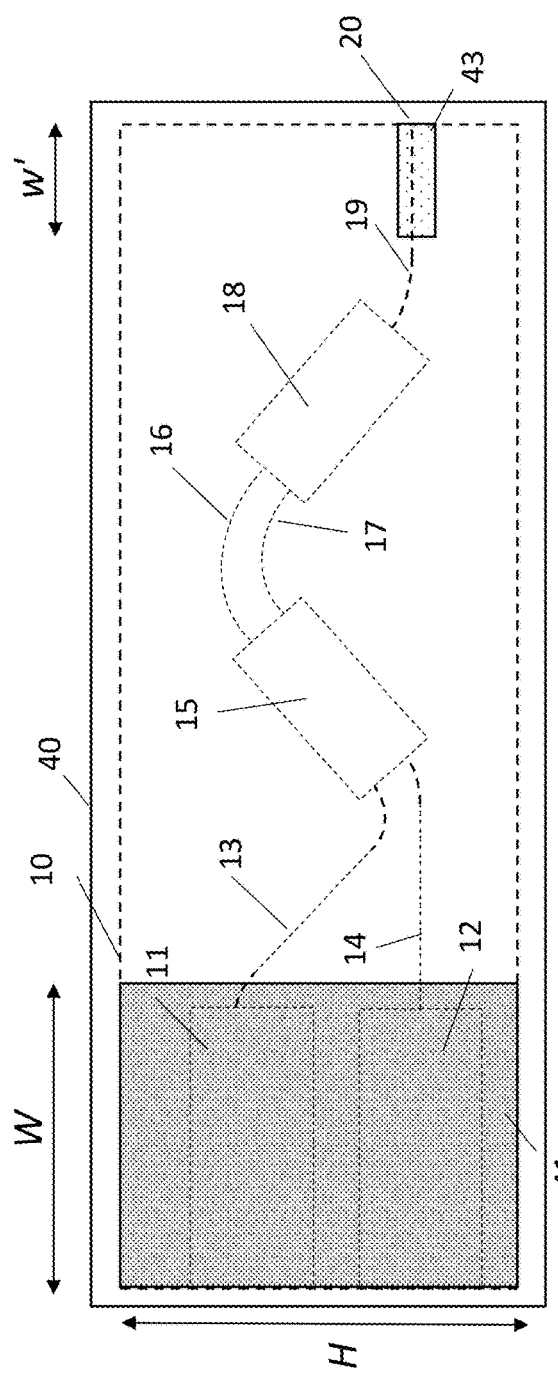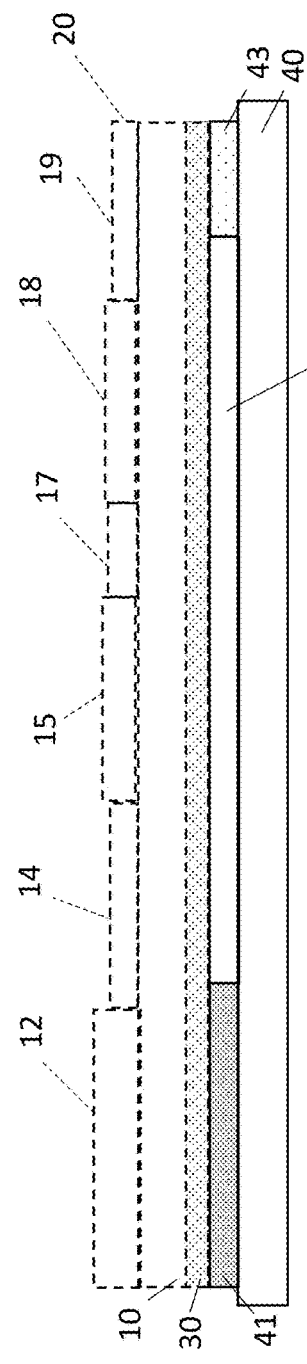
FIG.4C
FIG.4D

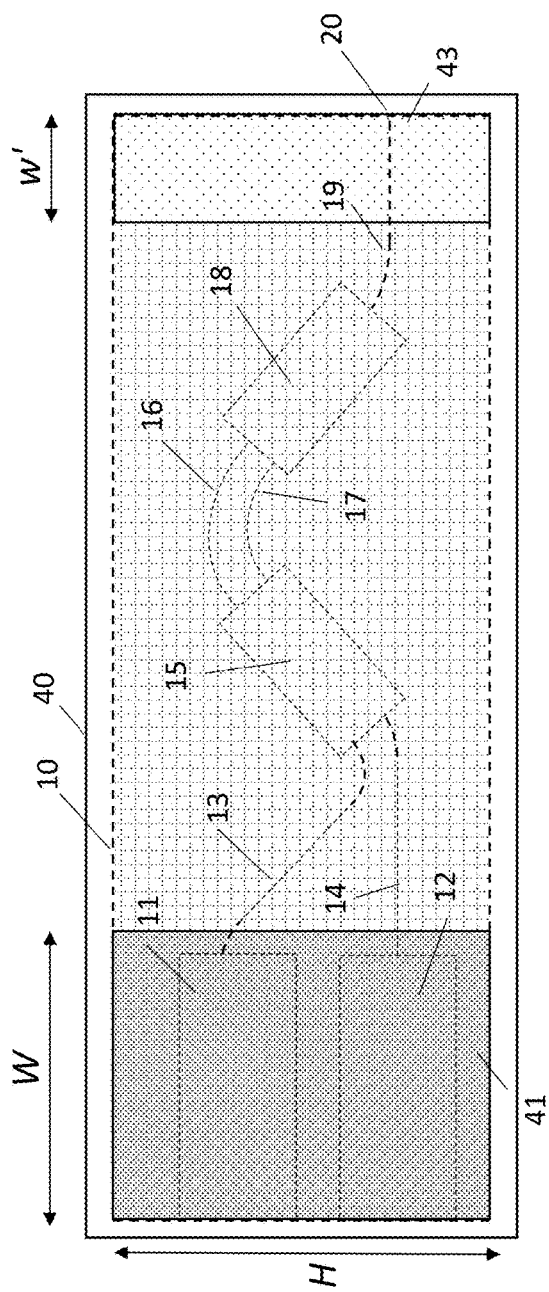
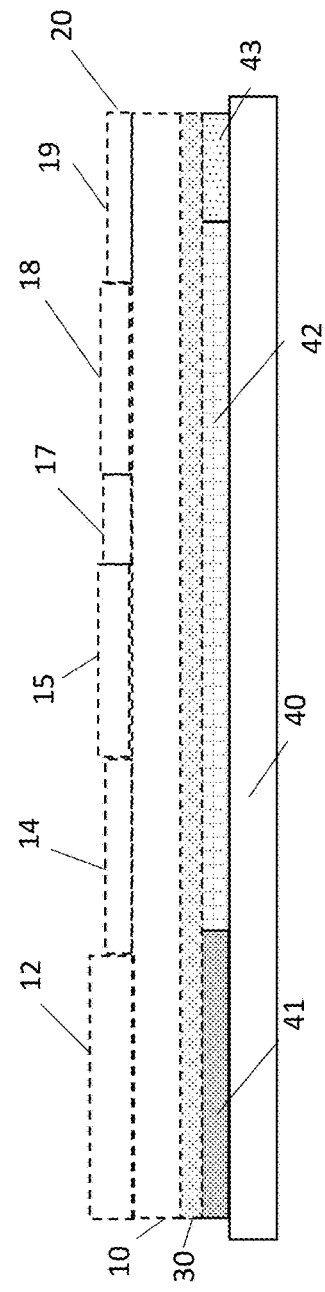
FIG.4E
FIG.4F

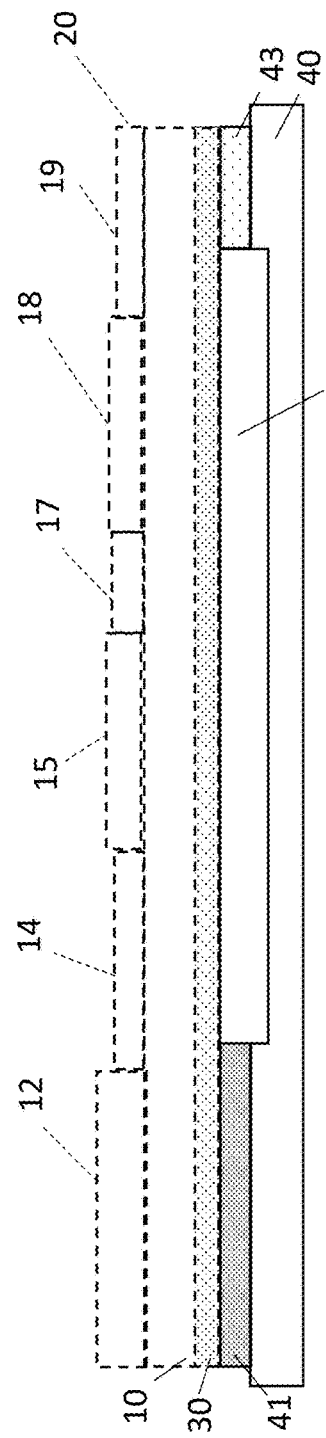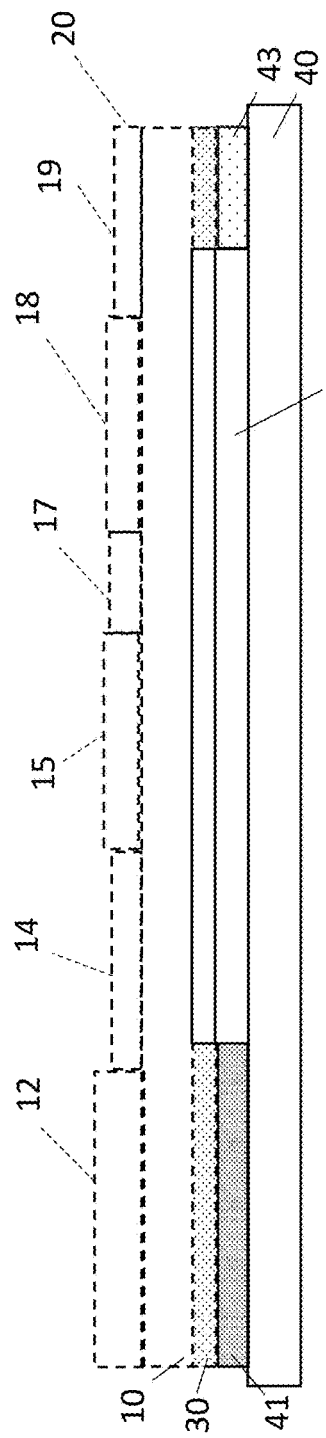

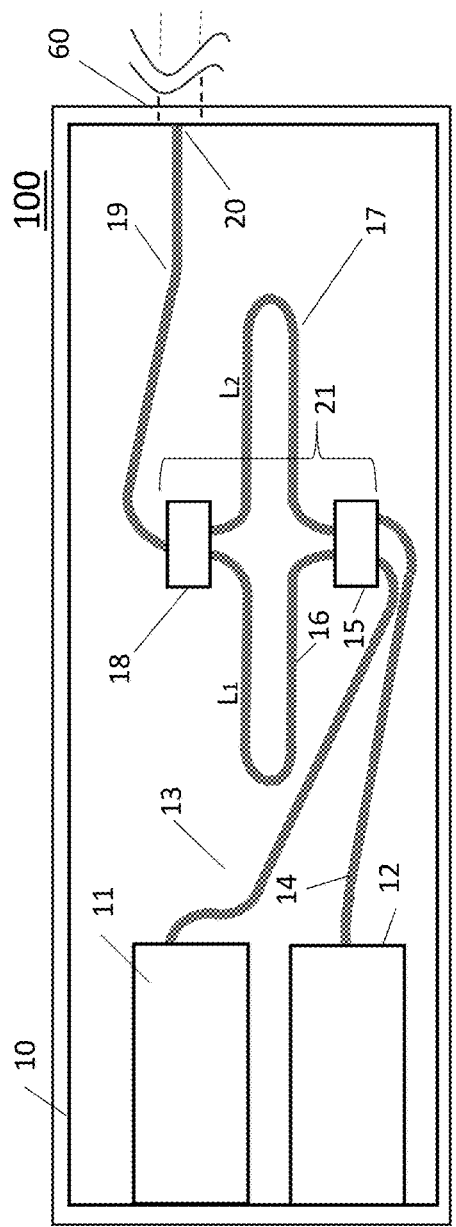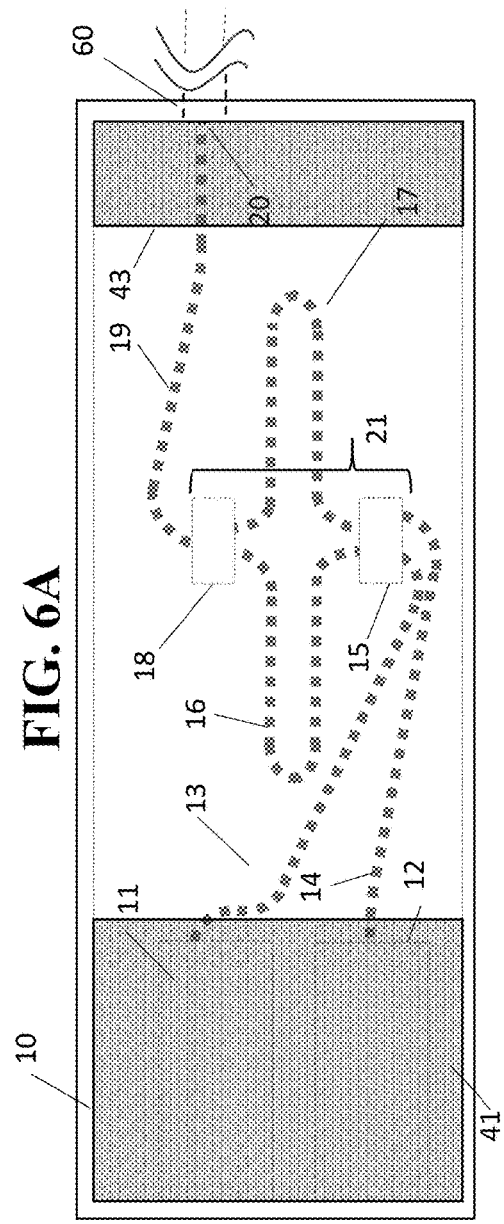
FIG. 6A
FIG. 6B

PHOTONIC INTEGRATED CIRCUIT

FIELD OF THE INVENTION

This invention relates to a photonic integrated circuit and a method for designing the photonic integrated circuit, and more specifically, a photonic integrated circuit having thermal conductors arranged with photonic components.

BACKGROUND OF THE INVENTION

Photonic integrated circuits (PICs) contain multiple optical devices including laser diodes and optical filtering components. Optical filtering components such as Mach-Zhender interferometers (MZIs) and arrayed waveguide routers (AWGRs) are very sensitive to fabrication process variations.

One of the main challenge is to align the wavelengths of lasers and optical filters, since fabrication process variations cause wavelength variations. In general, the wavelengths of lasers are better controlled than those of optical filters. The issue of optical filters, such as MZIs and AWGRs, is that the widths of the waveguides cannot be fabricated precisely enough according to the design, which causes variations of the transmittance wavelength spectra of the filters and resulting mismatches between the transmittance wavelength spectra and the operating wavelengths of lasers.

Due to specifics, scale and precision of manufacturing the photonic integrated circuits, it is difficult to control the widths of the waveguide precisely. However, due to the dimensions of waveguides, even a minor variation of the width can be significant in relative terms. For example, variations for width of 1.4 microns of the waveguide can be variation of 5% of the width of the waveguide, which causes significant wavelength shift from design.

Number of methods addresses this problem by manually and statically tuning the fabricated waveguides. For example, the method described in K. Watanabe et al., "Trimming of InP-based Mach-Zehnder interferometer filling side cladding of high-mesa waveguide with resin," Electronic Letters, vol. 47, p. 1245, 2011, uses trimming to tune the wavelength of a Mach-Zehnder interferometer, using material with different refractive index surrounding the waveguide to change the effective refractive index in one of the waveguide. This method, however, requires measurement of wavelength characteristics of each interferometer, and trimming each device one by one, adding packaging cost and time. Accordingly, there is a need to reduce dependencies of the wavelength characteristics of an interferometer on the precision of the fabrication process.

SUMMARY OF THE INVENTION

Embodiments of the present disclosure relate to photonic integrated circuits (PICs) including a submount adjusting temperature distribution of the PICs and methods for designing photonic integrated circuits, where wavelengths of light sources and maximum transmission wavelengths of asymmetric interferometers in the PICs are matched in a predetermined range of wavelengths.

Some embodiments are based on recognition that a change in temperature of waveguides can lead a change in the effective refractive index. According to embodiments of the present disclosure, the variations of maximum transmission wavelengths of asymmetric interferometers in a photonic integrated circuit having optical waveguides with different lengths can be reduced by adjusting the temperature of the interferometer by disposing on a submount selected from a predesigned group of submounts with different thermal conductor configurations having different thermal properties.

Some embodiments according to the present disclosure provide a photonic integrated circuit disposed on a substrate. The photonic integrated circuit includes first and second light sources to transmit a first light beam and a second light beam via first and second waveguides; an interferometer to combine the first and second light beams from the first and second waveguides and transmit a combined signal light beam from an output port of a combined waveguide; a contact layer formed on a backside of the substrate; and a submount to contact the contact layer, wherein the submount includes a first thermal conductor corresponding to regions of the first and second light sources, a second thermal conductor corresponding to a region of the interferometer and a third thermal conductor corresponding to a part of the third waveguide.

The photonic integrated circuits (PICs) including submounts according to embodiments of the present disclosure can provide cost effective photonic integrated circuits by implementing a method for adjusting a maximum transmittance wavelength of an interferometer with an operating wavelength of a light source in a photonic integrated circuit disposed on a submount having thermal conductors thereon, includes determining the operation wavelength $\lambda_o$ of the light source; determining a maximum transmittance wavelength $\lambda_m$ of the interferometer having an acceptable range of wavelengths $\lambda_m \pm \Delta\lambda$, wherein $\Delta\lambda$ is an acceptable deviation wavelength; and arranging a first thermal conductor having a first area and a second thermal conductor having a second area on the submount, wherein when $\lambda_o > \lambda_m - \Delta\lambda$, the first area is greater than the second area and the second area is arranged at an opposite end from the light source, wherein when the operation wavelength $\lambda_o$ is in the acceptable range of wavelengths $\lambda_m \pm \Delta\lambda$, the first thermal conductor or the second thermal conductor is arranged to fully include an area of the integrated circuit.

According to embodiments of the present disclosure, as the operating wavelengths of light sources and the maximum transmittance wavelength of an interferometer can be matched by arranging thermal conductors of a submount included in a photonic integrated circuit, cost effective photonic integrated circuits can be provided because the yield of PIC manufacturing process is increased.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the present disclosed embodiments.

FIG. 1B is a plan view of a photonic integrated circuit according to embodiments of the present disclosure;

FIG. 1C is a side view of a photonic integrated circuit according to embodiments of the present disclosure;

FIG. 4A is a plan view of a submount of a photonic integrated circuit according to embodiments of the present disclosure;

FIG. 4B is a side view of a submount of a photonic integrated circuit in FIG. 4A according to embodiments of the present disclosure;

FIG. 4C is a plan view of another submount of a photonic integrated circuit according to embodiments of the present disclosure;

FIG. 4D is a side view of another submount of a photonic integrated circuit in FIG. 4C according to embodiments of the present disclosure;

FIG. 4E is a side view of another configuration of a submount of a photonic integrated circuit according to embodiments of the present disclosure;

FIG. 4F is a side view of another configuration of a submount of a photonic integrated circuit in FIG. 4E according to embodiments of the present disclosure;

FIG. 4G is a side view of another configuration of a submount of a photonic integrated circuit according to embodiments of the present disclosure;

FIG. 4H is a side view of another configuration of a photonic integrated circuit according to embodiments of the present disclosure;

FIG. 6A shows a layout of the optical components in the photonic integrated circuit;

FIG. 6B shows a layout of thermal conductors on a submount and a layout of optical components on the substrate of the photonic integrated circuit;

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION OF THE PREFERRED EMBODIMENTS

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Various embodiments of the present invention are described hereafter with reference to the figures. It should be also noted that the figures are only intended to facilitate the description of specific embodiments of the invention. Further, size and shapes illustrated in the figures are intended to facilitate the description of embodiments, accordingly, the invention is not restricted to the size or shape as illustrated. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

Some embodiments of the present invention are based on recognitions that the wavelength selective manipulators are sensitive to wavelength variation introduced by the fluctuation of the temperature.

Figure 1A:
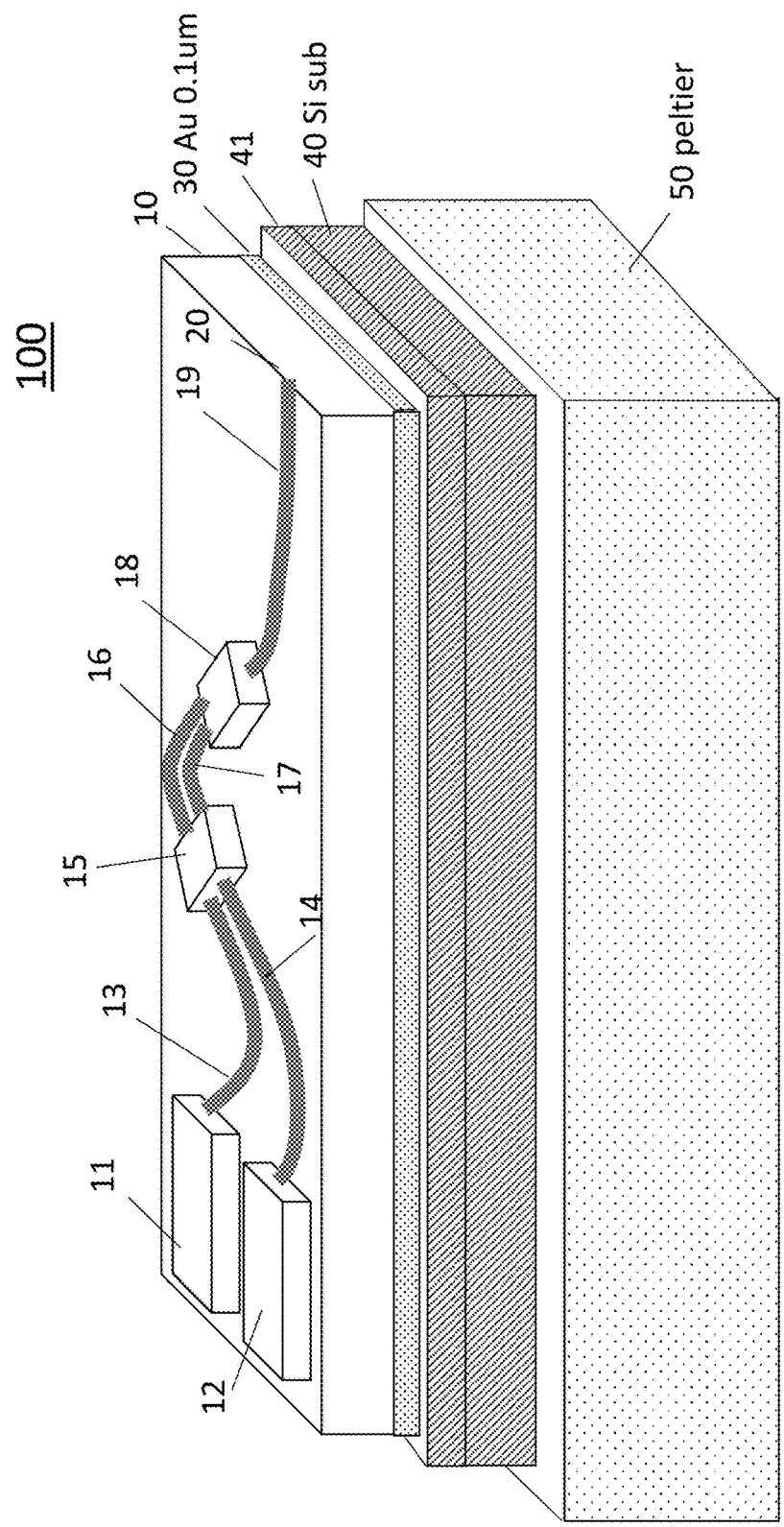
FIG. 1A is a perspective view of a photonic integrated circuit according to embodiments of the present disclosure.

FIG. 1A is a perspective view of a photonic integrated circuit 100 according to embodiments of the present disclosure. The photonic integrated circuit 100 includes optical components integrated on a substrate 10 with a contact layer 30. The photonic integrated circuit 100 is attached to a submount 40 via the bottom of the substrate 10 and a contact layer 30. The submount 40 is attached to a temperature-controlling thermo-electric cooler 50, e.g., a peltier device. The temperature-controlling thermo-electric cooler 50 may be referred to as a cooling device 50. The substrate 10 may be a semiconductor substrate such as an indium phosphide (InP), gallium arsenide (GaAs), gallium nitride (GaN), and silicon (Si). Further, the submount 40 may be formed by silicon, aluminum nitride (AlN) or Alumina.

FIG. 1B is a plan view of the photonic integrated circuit 100 of FIG. 1A. The photonic integrated circuit 100 includes optical parts 11-21, which are a first light source 11, a second light source 12, a first input waveguide 13, a second input waveguide 14, a Mach-Zehnder interferometer 21, and an output waveguide 19 with an output port 20. The Mach-Zehnder interferometer 21 also includes optical elements 15-18.

The optical parts 11-21 of the photonic integrated circuit 100 may be fully or partially buried in the substrate 10 according to the manufacturing process design, and the photonic integrated circuit 100 may be covered with a predetermined passivation film (not shown). As the figures in the present disclosure are provided only for explanations of each of parts and components of the photonic integrated circuit 100, the passivation film or a buried structure of the photonic integrated circuit 100 are omitted.

The optical elements 15-18 of the Mach-Zehnder interferometer 21 may be a 2×2 coupler 15, a first signal waveguide arm 16, a second signal waveguide arm 17, and a 2×1 coupler 18. The 2×2 coupler 15 may be referred to as a first coupler 15 and the 2×1 coupler 18 may be referred to as a second coupler 18. The first coupler 15 includes two input ports and two output ports. The second coupler 18 includes two input ports and one output port. The output port 20 is coupled to an optical fiber 60 to transmit optical signals either with or without a lens. The first and second optical light sources 11 and 12 may be laser diodes (LDs or semiconductor lasers). In some cases, the first and second optical light sources 11 and 12 may be electroabsorption-modulated lasers (EMLs). The first light source 11 transmits a first light beam having a first peak wavelength $\lambda_1$ from an output port of the first light source 11. The first light beam propagates through the first input waveguide 13 and is input to a first input port of the first coupler 15. The second light source 12 transmits a second light beam having a second peak wavelength 22 from an output port of the second light source 12. The second light beam propagates through the second input waveguide 14 and is input to a second input port of the first coupler 15. The first coupler 15 splits the first light beam into a first optical signal and transmits half of the first optical signal through the first signal waveguide arm 16 to an input port of the second coupler 18, and the rest of the first optical signal through the second signal waveguide arm 17 to another input port of the second coupler 18. Further, the first coupler 15 splits the second light beam into a second optical signal and transmits half of the second optical signal through the first signal waveguide arm 16 to an input port of the second coupler 18, and the rest of the second optical signal through the second signal waveguide arm 17 to another input port of the second coupler 18. The second coupler 18 combines the first and second optical signals and transmits a combined signal from an output portion of the second coupler 18 through an output waveguide 19 (output arm 19). Further, the optical fiber 60 is coupled to the output port 20 of the second coupler 18 for transmitting the combined signal via the optical fiber 60 to an optical signal receiver (not shown). The Mach-Zehnder interferometer 21 comprises of the optical components 15-19. The length of the two waveguide arms 16 and 17 are different, and the phase relationship of the optical signals after 16 and 17 depends on the wavelength. The difference of the waveguide arms 16 and 17 determines the periodicity as well as the exact peak wavelengths of the transmittance.

FIG. 1C is a side view of the photonic integrated circuit 100 seen from a section A-A' in FIG. 1B. The submount 40 is bonded to the contact layer 30 via the thermal conductor 41 disposed on the submount 40. A thickness of the substrate 10 may be from 20 μm to 300 μm. For instance, the thickness of the substrate 10 may be 100 μm. The submount 40 contacts the substrate 10 through the contact layer 30. The contact layer 30 may be gold (Au) with approximately 0.1-0.5 μm in thickness. The submount 40 is accommodated on the cooling device 50 for thermal management of the photonic integrated circuit 100. The cooling device 50 may be attached with a heat sink (not shown) according to thermal management designs. The submount 40 may be formed from an aluminum nitride (AlN) substrate, silicon substrate or a glass substrate. The thermal conductor 41 may be gold (Au) or gold-tin (Au/Sn) alloy films having around 2~6 μm in thickness. The composition of gold-tin may be 80% Au and 20% Su. The arrangement of thermal conductors 41-43 on the submount 40 provides variety of temperature distributions in the photonic integrated circuit 100, which will be discussed below.

During the operations of the photonic integrated circuit 100, the light sources 11 and 12 generate heat and the heat spreads (conducts) to the submount 40 via the thermal conductor 41 and reaches the cooling device 50. As a result, temperatures at the positions where the first and second waveguide arms 16 and 17 are disposed rise beyond an ambient temperature (e.g. over a room temperature) by the heat conducting from the first and second light sources 11 and 12. At a steady state during operations, the first and second waveguide arms 16 and 17 reach a designed (predetermined) range of temperatures.

Figure 2A:
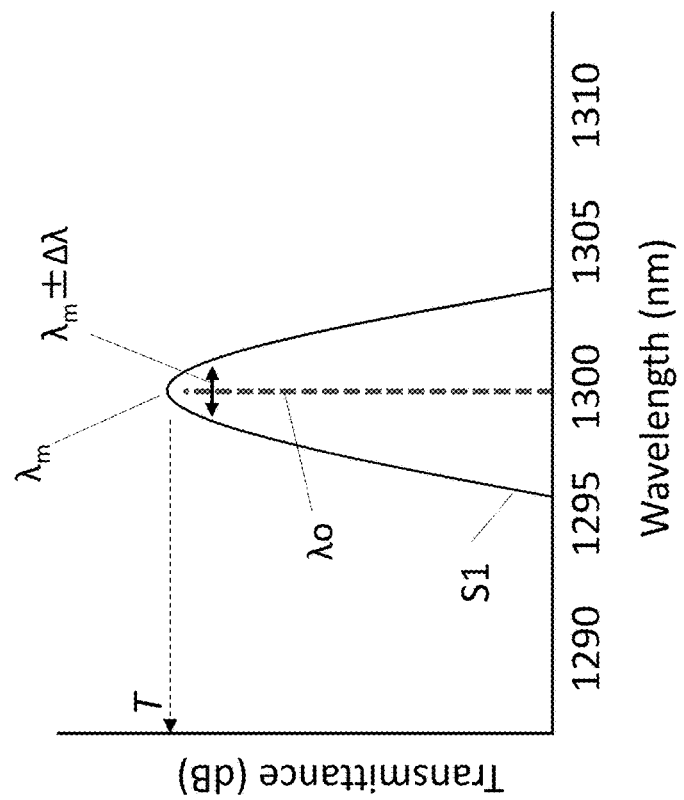
FIG. 2A shows transmittance spectra of an interferometer disposed in the photonic integrated circuit according to embodiments of the present disclosure.

FIG. 2A shows transmittance spectra of an interferometer disposed in the photonic integrated circuit according to embodiments of the present disclosure. The wavelengths indicated are example values for explaining a relationship between the transmittance spectra of a coupler and the wavelengths of an operating wavelength of a light source. The transmittance spectrum S1 shows the maximum transmittance T at the maximum transmittance wavelength $\lambda_m$. In the present disclosure, the maximum transmittance wavelength $\lambda_m$ indicates a wavelength that corresponds to the maximum transmittance in the transmittance spectrum of an interferometer. The interferometer may be an optical filter or a coupler (combiner).

It is indicated that the operating wavelength $\lambda_o$ of the light source is matched in a predetermined range of wavelengths $\lambda_m \pm \Delta\lambda$ to avoid the loss of the signal intensity while propagating the interferometer. The light source may be a laser diode or an electroabsorption-modulated lasers (EML). For instance, when a laser diode is used as the light source, the operating wavelength $\lambda_o$ can be a lasing wavelength of the laser diode.

As mentioned above, the operating wavelength $\lambda_o$ of the light source is located in a predetermined range of wavelength variations $\lambda_m \pm \Delta\lambda$ of the transmittance spectrum S1, matching well with the maximum transmittance wavelength $\lambda_m$, where $\Delta\lambda$ is an acceptable variation wavelength obtained from a predetermined factor $\alpha(=0.0005 \sim 0.001\%)$ of the wavelength $\lambda_m$; i.e., $\Delta\lambda = \alpha \times \lambda_m$. For instance, when the maximum transmittance wavelength $\lambda_m$ is designed to be 1.3 μm (1300 nm), $\Delta\lambda$ can be 0.00065~0.0013 μm (0.65 nm~1.3 nm). Accordingly, when assuming that $\Delta\lambda=1.3$ nm, the predetermined range of wavelengths $\lambda_m \pm \Delta\lambda$ can be 1.2987 μm~1.3013 μm (1298.7 nm~1301.3 nm). The maximum transmittance wavelength $\lambda_m$ may be another wavelength in a range from 1.260 μm to 1.625 μm. As seen in the figure, when the operating wavelength $\lambda_o$ positions in the predetermined range of wavelengths (wavelength variation) $\lambda_m \pm \Delta\lambda$, the transmission loss of the signal intensity via the interferometer is significantly low (reduced) while operating the photonic integrated circuit 100.

When the operating wavelength $\lambda_o$ of the light source and the maximum transmittance wavelength $\lambda_m$ are properly matched, a sufficient transmittance T is obtained for performing effective transmission of the signal via the interferometer. On the other hand, if the transmittance spectrum S1 shifts toward either a longer or shorter wavelength, the operating wavelength $\lambda_o$ becomes out of the range of wavelengths $\lambda'_m \pm \Delta\lambda'$, and a transmittance T' at the operating wavelength $\lambda_O$ produces a great amount of transmission loss of the signal while propagating through the interferometer.

This situation can happen when the optical properties (e.g. effective refractive index) of the materials of the interferometer changes with temperature of the materials. According to our knowledge, in some cases, a temperature dependence of the maximum transmittance wavelength $\lambda_m$ can be approximated by ~0.09 nm/° C. (or nm/K). This indicates that the transmittance spectrum with the maximum transmittance wavelength $\lambda_m$ shifts toward a longer wavelength by 0.09 nm when the temperature of the interferometer rises by 1° C. (1K). It should be noted that a 0.1 nm to 0.2 nm shift of the transmittance spectrum can significantly increase the signal loss through the interferometer when the operating wavelength $\lambda_o$ is near the edge of the predetermined range of wavelengths $\lambda_m \pm \Delta\lambda$.

For instance, some photonic integrated circuits include light sources with operating power around 100 mW and interferometers, which are arranged apart by a couple of hundred micrometers (100~300 µm) on an identical substrate. In such case, the interferometers can be raised by a couple of degree Celsius (° C.) by the heat conducting from the light sources during operations of the light sources.

Figure 2B:
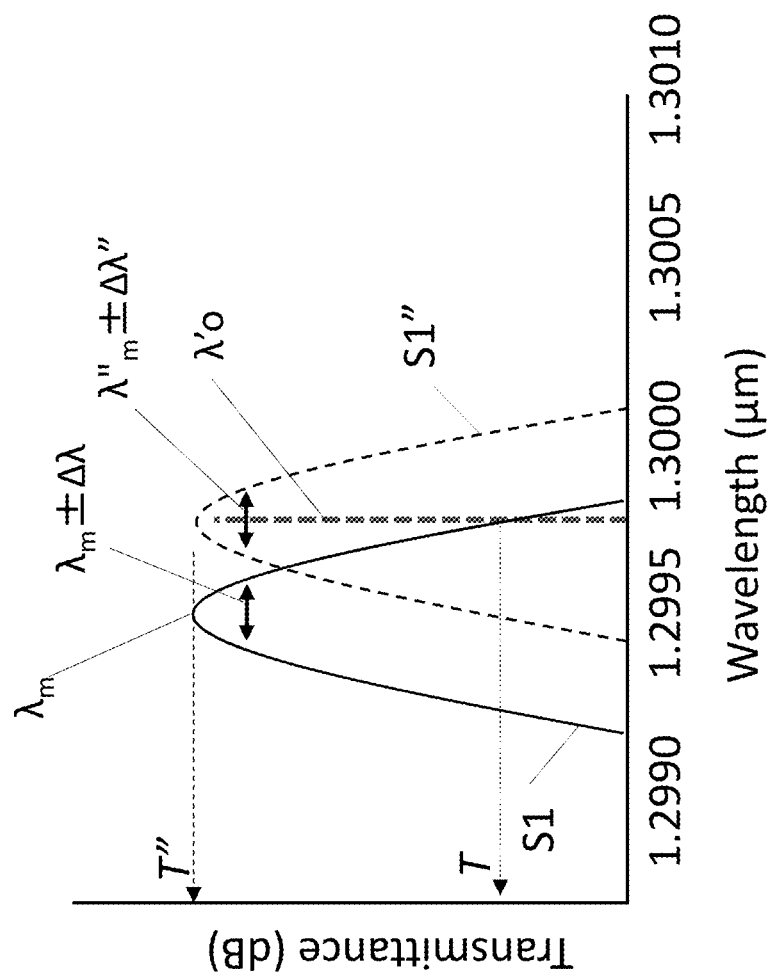
FIG. 2B shows other transmittance spectra of another interferometer disposed in the photonic integrated circuit according to embodiments of the present disclosure.

FIG. 2B shows other transmittance spectra of another interferometer disposed in the photonic integrated circuit according to embodiments of the present disclosure. The interferometer has a transmittance spectrum S1 with a maximum transmittance wavelength $\lambda_m$. In this case, an operating wavelength $\lambda'_o$ of the light source is located out of the range of wavelength variations $\lambda_m \pm \Delta\lambda$ of the transmittance spectrum S1. This situation can happen when the process variations took place while manufacturing the interferometer. FIG. 2B also indicates a transmittance spectrum S1" having a maximum transmittance wavelength $\lambda''_m$ with a range of wavelength variations $\lambda''_m \pm \Delta\lambda''$. The transmittance T of the transmittance spectrum S1 is quite low at the operating wavelength $\lambda'_O$, while a transmittance T" of the transmittance spectrum S1" is sufficiently high. Accordingly, if the transmittance spectrum S1 shifts to the transmittance spectrum S1", the signals can be effectively transmitted via the interferometer. According to embodiments of the present disclosure, it is possible to move the transmittance spectrum S1 toward the transmittance spectrum S1" by controlling a local heat conductance of the substrate of the photonic integrated circuit. For instance, when the heat generated by the light sources can be effectively transferred to the interferometer to raise the temperature of the interferometer, the transmittance spectrum S1 can be shifted toward the transmittance spectrum S1".

Some embodiments of the invention provide a method and a photonic integrated circuit, which allow to manage local temperatures of the photonic integrated circuit including the MZI for matching the peak wavelength of a coupler and the operation wavelength of a light source in a predetermined range without requiring extra local active temperature control units.

Simulations of Temperature Distribution

Figure 3A:
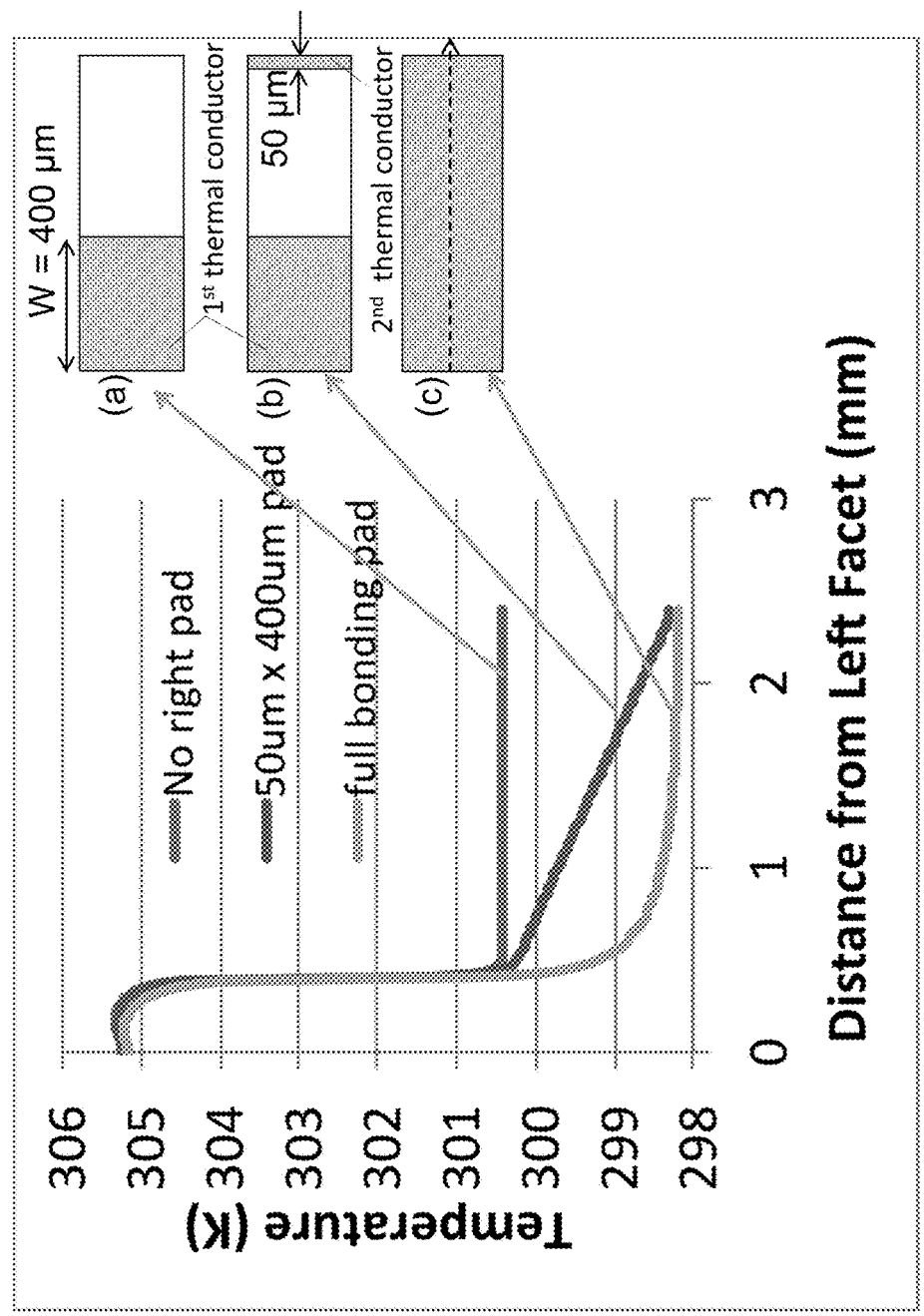
FIG. 3A is simulation results indicating temperature distributions of the photonic integrated circuit for different arrangements of thermal conductors on a submount according to embodiments of the present disclosure.
Figure 3B:
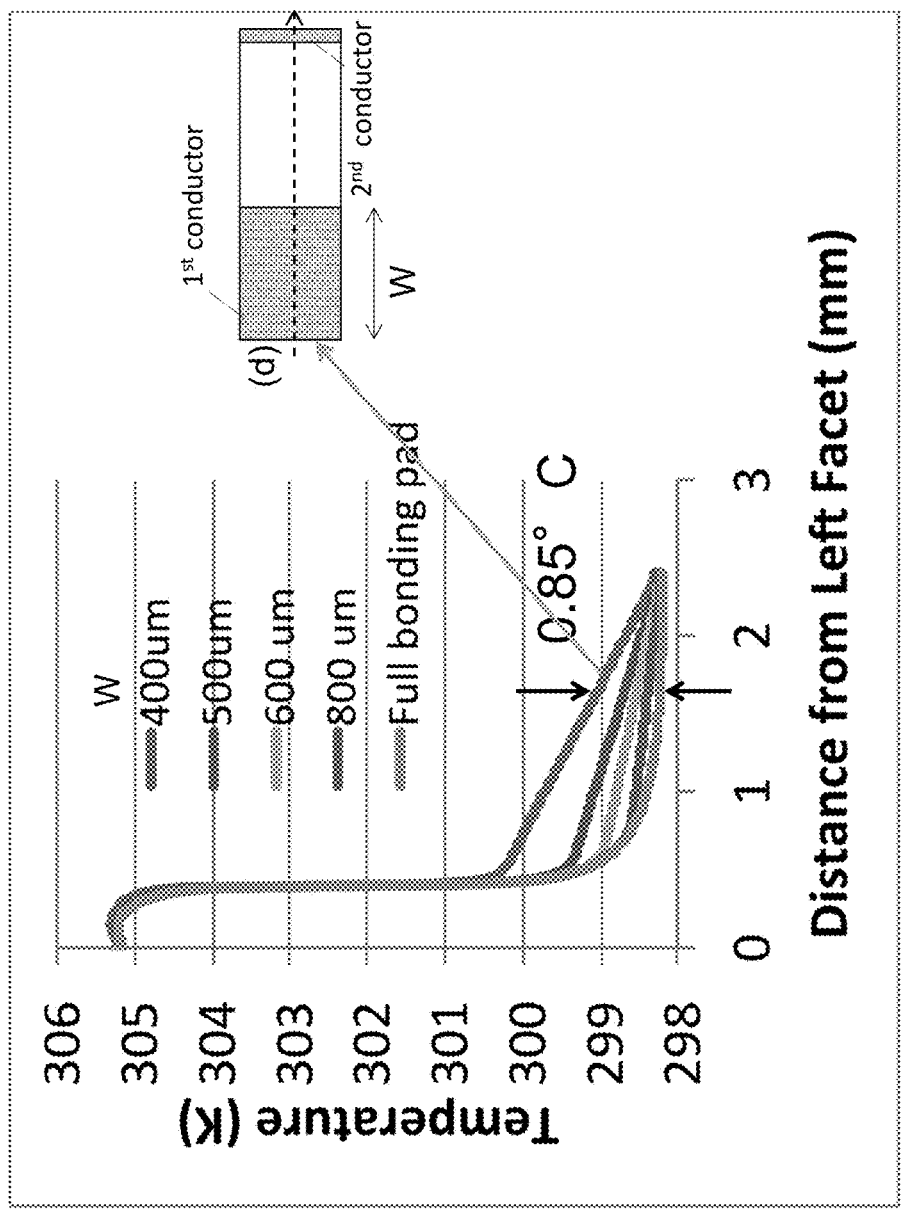
FIG. 3B is simulation results indicating temperature distributions of the photonic integrated circuit for different areas of thermal conductors on a submount according to embodiments of the present disclosure.
Figure 3C:
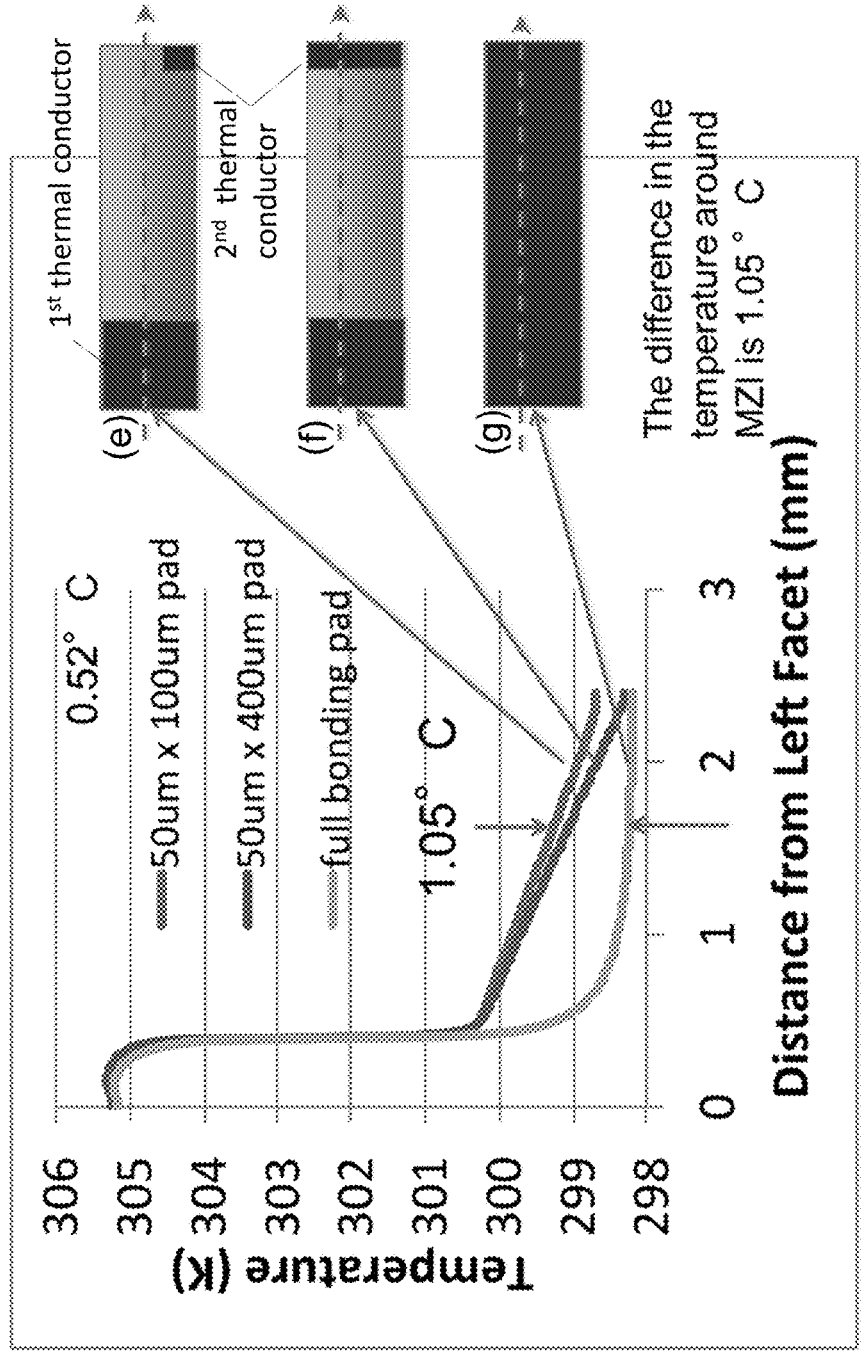
FIG. 3C is simulation results indicating temperature distributions of the photonic integrated circuit for different area coverage of thermal conductors on a submount according to embodiments of the present disclosure.

Simulations of temperature distributions in a photonic integrated circuit 100 are shown in FIG. 3A, FIG. 3B and FIG. 3C. The configuration of the photonic integrated circuit 100 is assumed as FIG. 1A and FIG. 1B. In the simulations, although an example configuration of a photonic integrated circuit is used, the simulation results can be applied to alternative designs of photonic integrated circuits to control or design the temperature distributions of the photonic integrated circuits. As designing variables, the arrangement of thermal conductors is changed. Other parameters used in the simulations for simulation purpose, which are as follows.

Size of a photonic integrated circuit: 0.4 mm×2 4 mm
Heat sources: 400 µm-long two light sources operating at 100 mW each, being separately disposed at the left end of the substrate 100
Substrate: indium phosphide (InP) with 0.1 mm in thickness FIG. 3A is simulation results indicating temperature distributions of the photonic integrated circuit for different arrangements of thermal conductors on a submount according to embodiments of the present disclosure.

Thermal conductors with different areas are arranged at the right and left ends of the submount. Gold films with 5 µm in thickness are arranged as the materials of the thermal conductors. The submount may be a high thermal conductive material such as aluminum nitride (AlN) or Beryllium Oxide (BeO). Various arrangements of the thermal conductors are shown as arrangements (a), (b) and (c), respectively.

Arrangement (a) includes a single thermal conductor on which the light sources are disposed (left end of the submount). The area of the thermal conductor can cover the area that includes the first and second light sources (400 µm-wide, see FIG. 3A). The temperature immediately drops up to the edge of the thermal conductor and remains a constant around 305K. The single thermal conductor in FIG. 3A may be referred to as a first thermal conductor.

As the constant temperature region corresponds to the areas on which the interferometers are disposed, the temperatures of the interferometers are raised by around 2K (2° C.) from an ambient temperature (~298K) by the heat conducting from the light sources. This effect can be applied to a photonic integrated circuit when s transmittance spectrum needs to be shifted toward a longer wavelength's transmittance spectrum.

Arrangement (b) includes a 50 µm-wide thermal conductor (second thermal conductor) at the right end of the submount in addition to the first thermal conductor of FIG. 3A. The temperature linearly drops from the right edge of the first thermal conductor to the right end of the submount. The effect of linear temperature drop can be applied to arbitrarily control the temperature distribution in the photonic integrated circuit by arranging additional thermal conductors.

Arrangement (c) shows a case where the thermal conductor fully covers the submount. In this case, the temperature immediately drops to the right end of the submount and remains at the ambient temperature. This effect can be applied when the temperatures of the interferometers are designed to stay at the ambient temperature.

FIG. 3B is simulation results indicating temperature distributions of the photonic integrated circuit for different areas of thermal conductors on a submount according to embodiments of the present disclosure. The area of the first thermal conductor are varied from 400 µm to 800 µm. This indicates that the temperature distribution around the interferometers can be accurately adjusted in a predetermined temperature range (e.g. 0.85K in FIG. 3B) by arbitrarily changing the area of the first conductor while maintaining the area of the second thermal conductor to be constant.

FIG. 3C is simulation results indicating temperature distributions of the photonic integrated circuit for different area coverage of thermal conductors on a submount according to embodiments of the present disclosure. In this case, the area of the second thermal conductor is reduced to ¼. The temperature linearly drops from the right edge of the first thermal conductor to the right end of the submount. The slope of the temperature drop can be controlled by changing the area of the second thermal conductor. In other words, the transmittance spectrum can be adjusted toward a longer wavelength with a small amount of a wavelength.

Adjustment of Temperature of the Interferometers

Accordingly, some embodiments of the present disclosure are based on recognitions that a photonic integrated circuit having optical components arranged on a substrate includes a submount with thermal conductors separately arranged on the submount for providing a matching between an operating wavelength of a light source and a transmittance spectrum of an interferometer. In this case, the photonic integrated circuit includes first and second light sources, respectively, configured to transmit a first light beam and a second light beam via first and second input waveguides, a first coupler configured to split the first and second light beams received from the first and second input waveguides into a first signal and a second signal and transmit the first and second signals via first and second signal waveguides, a second coupler configured to combine the first and second signals received from the first interferometer via the first and second signal waveguides and transmit a combined signal via a third waveguide, a contact metal layer formed on a backside of the substrate and a submount configured to contact the contact metal layer via the thermal conductors of the submount, wherein the thermal conductors include a first thermal conductor having a first thermal conductivity and a second conductor having a second thermal conductivity, wherein the first thermal conductivity is greater than the second thermal conductivity, and the first conductor is arranged to fully cover bottom areas of the first and second light sources.

Further, an area of the first thermal conductor is larger than an area of the second thermal conductor, and the first and second optical sources are arranged more proximity to the first thermal conductor than the second thermal conductor. FIG. 4A is a plan view of a submount of a photonic integrated circuit according to embodiments of the present disclosure. In the figure, the optical components 11-19 arranged in the photonic integrated circuit 100 are indicated by dashed lines. The submount 40 includes the first thermal conductor 41 having a first thermal conductivity, a second thermal conductor 42 (see FIG. 4B) having a second thermal conductivity and a third thermal conductor 43 having a third thermal conductivity on the top of the submount 40. The first thermal conductor 41 is arranged to include an approximate area of the first and second light sources 11 and 12, and the third thermal conductor 43 is arranged to partially include an area of the output waveguide 19. Further, the second thermal conductor 42 may include air gap having a thermal conductivity of air.

FIG. 4B shows a side view of the submount 40 of the photonic integrated circuit 100 shown in FIG. 4A. It is seen that the first thermal conductor 41 is located to support the first and second light sources 11 and 12 via the contact layer 30. The third thermal conductor 43 is arranged to support the area of the output waveguide 19 and the output port 20 of the photonic integrated circuit 100. As the third thermal conductor 43 is also used to support the output waveguide 19 with the output port 20 which is to be connected to the optical fiber 60 when being set in an optical communication system, the third thermal conductor 43 and the first thermal conductor 41 are arranged to have the same thickness to maintain mechanical strength and the optical alignment from the first and second light sources 11 and 12 to the output waveguide 19 via the optical components 13-19.

In this case, an air (air gap) is used as the second thermal conductor 42, in which the thermal conductivity of air is assumed to be around 0.002 (W/m-K). The first and third conductors 41 and 43 may be identical material. For instance, the first and third conductors 41 and 43 may be gold films, in which gold has a thermal conductivity of approximately 310 (W/m-K).

This configuration of the thermal conductors is relevant to the arrangement (b) of FIG. 3A, the arrangement (d) of FIG. 3B and the arrangement (f) of FIG. 3C. When the area of the first thermal conductor 11 is changed with maintaining the area of the third thermal conductor 43 constant, the temperature of areas of the first and second coupler 15 and 18 can be controlled precisely with a small temperature step, since a dominant amount of heat generated by the first and second light sources flows vertically to the first thermal conductor via the contact layer 30, and the rest of the heat flows to the third thermal conductor along the substrate 10 and the contact layer 30. In this case, as the second thermal conductor 42 is an air gap having the third thermal conductivity, the amount of heat flowing through the air gap can be neglected. In other words, a thermal resistance of the first thermal conductor 41 is smaller than that of the second thermal conductor 42, and a thermal resistance of the third thermal conductor 43 is smaller than that of the second thermal conductor 42. Further, as the area of the first thermal conductor 41 is greater than that of the third thermal conductor 43, the thermal resistance of the first thermal conductor 41 is smaller than that of the third thermal conductor 43.

According to embodiments of the present disclosure, the area of the first thermal conductor 12 can be arranged to fully include the area of the first and second light sources 11 and 12. Namely, the heat generated by the first and second light sources 11 and 12 is vertically and effectively conducted through the first thermal conductor 12 via the substrate 10 and the contact layer 30.

In some cases, the second thermal conductor 42 may be an epoxy resin having a thermal conductivity of approximately 0.35 (W/m-K), so that the second thermal conductivity is approximately three orders of magnitude less than the first thermal conductance.

FIG. 4C is a plan view of another submount of a photonic integrated circuit according to embodiments of the present disclosure. In this case, the first thermal conductor 41 is identical to that of FIG. 4A, the second thermal conductor 42 is the air gap and the third thermal conductor 43 is an epoxy resin that is arranged only to support a predetermined area of the output waveguide 19. The side view of the submount 40 is shown in FIG. 4D. As the third thermal conductor 43 is formed with the epoxy resin, the first thermal conductivity of the first thermal conductor 41 is at least one order of magnitude greater than the third thermal conductivity. When a gold film with a 5 um-thick is used as the first thermal conductor 41, the first thermal conductivity (gold: ~310 (W/m-K)) is approximately three orders of magnitude greater than the third thermal conductor. Further, as the second thermal conductor 42 is an air, the third thermal conductivity is one order of magnitude greater than that of the second thermal conductivity. This configuration of the thermal conductors of the submount 40 allows to accumulate the heat conducting from the light sources 11 and 12 and raises the temperature of the first and second couplers 15 and 18 with an approximately constant temperature profile. This situation is similar to the case of the arrangement (a) in FIG. 3A. This effect can be applied when the maximum transmittance wavelength $\lambda_m$ is smaller (shorter) than the operating wavelength $\lambda_o$, which is discussed above with respect to FIG. 2B.

FIG. 4E is a plan view of another submount of a photonic integrated circuit according to embodiments of the present disclosure. In this case, the third conductor 43 is an epoxy resin and arranged to fully cover the right end of the submount 40, while the second thermal conductor 42 may be an air gap, a silicon dioxide film or a glass film corresponding to the area between the first thermal conductor 41 and the third thermal conductor 43. This configuration can slightly reduce the temperature of the area of the first and second couplers 15 and 18 from the case of FIG. 4D.

FIG. 4F is a side view of another configuration of a submount of a photonic integrated circuit according to embodiments of the present disclosure. In this case, the second thermal conductor 42 may be a semiconductor material such as silicon (~1.3 W/m-K), indium phosphide (~68 (W/m-K)) or gallium arsenide (~52 (W/m-K)).

FIG. 4G is a side view of another configuration of a submount of a photonic integrated circuit 100 according to embodiments of the present disclosure. In this case, the second thermal conductor 42 may be an air gap including a groove in the submount to further reduce lateral heat transfer from the light sources 11 and 12 to the output waveguide 19, so that the temperature gradient between the light sources 11 and 12 and the output waveguide 19 becomes gentle.

FIG. 4H is a side view of another configuration of a photonic integrated circuit 100 according to embodiments of the present disclosure. In this case, the contact layer 30 may be selectively omitted to further reduce the lateral heat transfer. The second thermal conductor 42 may be anything, including an air gap, a silicon dioxide film, or a gold film.

Adjustment of Transmittance Spectrum of Interferometer

Figure 5A:
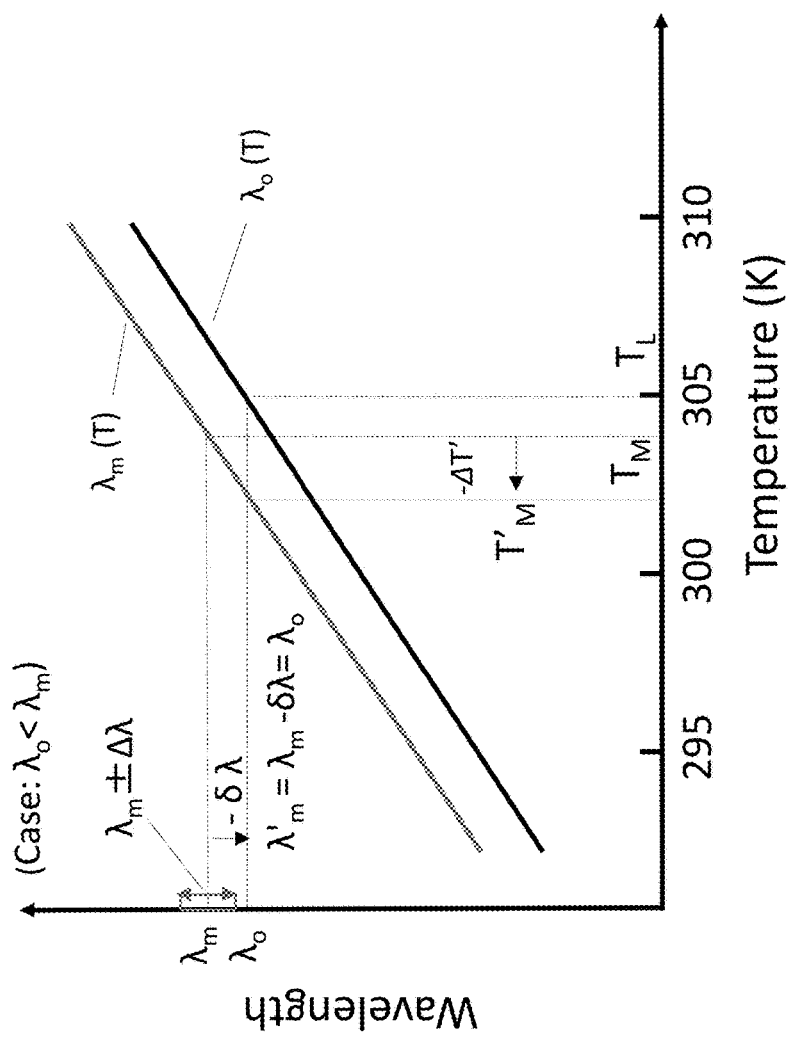
FIG. 5A shows an operating wavelength $\lambda_o$ of a light source and a maximum transmittance wavelength of an interferometer as a function of temperature.

FIG. 5A shows an operating wavelength of a light source and a maximum transmittance wavelength of an interferometer as a function of temperature. It is assumed that the temperature dependencies of the refractive indices with respect to the light source and the interferometer are similarly and linearly changed, because the light source and the interferometer in a photonic integrated circuit are fabricated by similar semiconductor materials in general. However, even in a case where those temperature dependencies or temperature sensitivity (slopes in the figure) are different each other because of usage of different materials, a method for adjusting the transmittance spectrum of interferometer can be applied to other configurations of photonic integrated circuits based on embodiments described in the present disclosure.

FIG. 5A indicates that the light source operates at an operating wavelength $\lambda_o$ and a temperature $T_L$, and an interferometer has a maximum transmittance wavelength $\lambda_m$ that is greater than the operating wavelength $\lambda_o$ ($\lambda_o < \lambda_m$) at a temperature $T_M$. In this case, the operating wavelength $\lambda_o$ is out of the predetermined range (an acceptable range) of wavelengths $\lambda_m \pm \Delta\lambda$ of the interferometer. In other words, the operating wavelength $\lambda_o$ is shorter than a minimum acceptable wavelength $\lambda_m - \Delta\lambda$, wherein $\Delta\lambda$ is an acceptable deviation wavelength. According to the figure, a significant transmission loss of signal intensity via the interferometer can be reduced if the maximum transmittance wavelength $\lambda_m$ shifts to another maximum transmittance wavelength $\lambda'_m$ that matches with the operating wavelength $\lambda_o$. As indicated in the figure, the maximum transmittance wavelength $\lambda'_m$ is obtained by reducing the maximum transmittance wavelength $\lambda_m$ by an adjustment wavelength $\delta\lambda$, i.e., $\lambda'_m = \lambda_m - \delta k = \lambda_o$. This can be made by reducing the temperature $T_M$ of the interferometer by an adjustment temperature $\Delta T'$. As discussed above, for instance in FIG. 3A, the temperature of the interferometer can be decreased by the configuration of the thermal conductor. With respect to arrangements (a) and (c), temperature reduction of approximately 2K can be made by fully covering the submount with the thermal conductor material (see position from 0.4 mm to the end of the facet). This relation indicates that such temperature reduction could be enough for adjusting the maximum transmittance wavelength from $\lambda_m$ to $\lambda'_m$. For instance, the thermal conductor may be a 5 μm-thick gold film in this case.

Figure 5B:
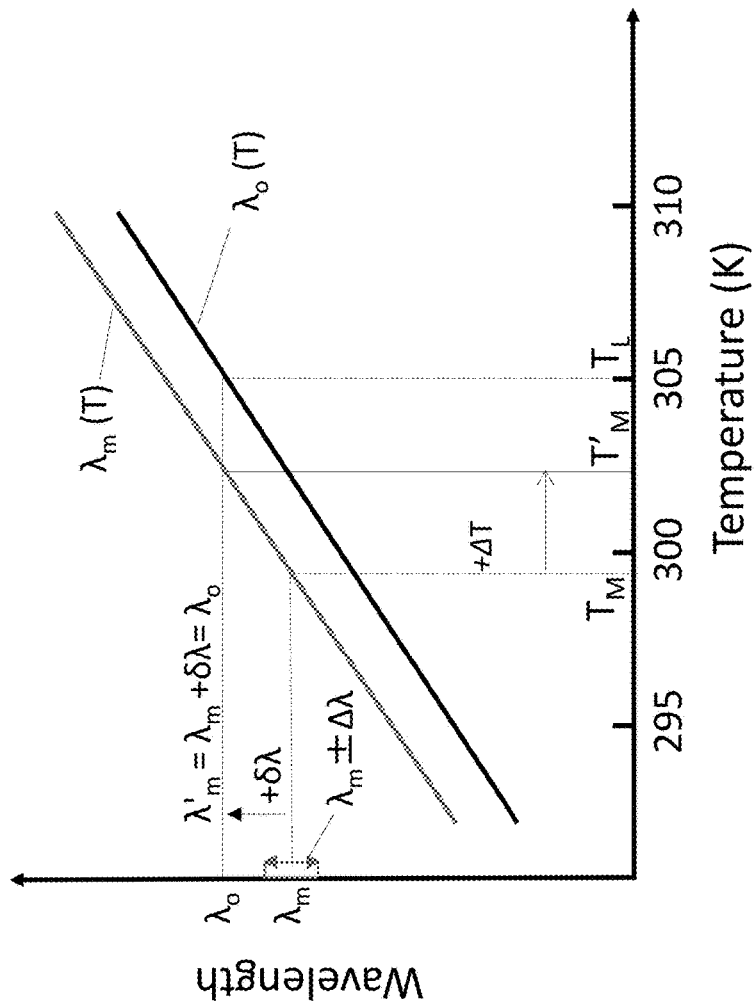
FIG. 5B shows an operating wavelength $\lambda_o$ of a light source and a maximum transmittance wavelength of an interferometer as a function of temperature.

FIG. 5B shows an operating wavelength of a light source and a maximum transmittance wavelength of another interferometer as a function of temperature. It is indicated that the light source operates at an operating wavelength $\lambda_o$ and a temperature $T_L$, and an interferometer has a maximum transmittance wavelength $\lambda_m$ that is greater than the operating wavelength $\lambda_o$ ($\lambda_o > \lambda_m$) at a temperature $T_M$. In this case, the operating wavelength $\lambda_o$ is out of the predetermined range of wavelengths $\lambda_m \pm \Delta\lambda$ of the interferometer. In other words, the operating wavelength $\lambda_o$ is greater than a maximum acceptable wavelength $\lambda_m + \Delta\lambda$. This configuration of the photonic interferometer would cause a significant transmittance loss of signal intensity while the signal propagates through the interferometer. According to the figure, the significant transmission loss of signal intensity can be reduced if the maximum transmittance wavelength $\lambda_m$ shifts to another maximum transmittance wavelength $\lambda'_m$ that matches with the operating wavelength $\lambda_o$. As indicated in the figure, the maximum transmittance wavelength $\lambda'_m$ is obtained by increasing the maximum transmittance wavelength $\lambda_m$ by an adjustment wavelength $+\delta\lambda$, i.e., $\lambda'_m = \lambda_m + \delta\lambda = \lambda_o$. This can be made by raising the temperature $T_M$ of the interferometer by an adjustment temperature $\Delta T'$. As discussed above, for instance in FIG. 3A through FIG. 3C, the temperature of the interferometer can be increased by changing the configuration of the thermal conductor. According to the arrangements (a) and (c) in FIG. 3A, the temperature of the interferometer can be raised by approximately 2K by partially covering the submount with the thermal conductor material (see position from 0.4 mm to the end of the facet in the arrangement (a)). This relation indicates that such temperature increase could be enough for adjusting the maximum transmittance wavelength from $\lambda_m$ to $\lambda'_m$. For instance, the thermal conductor may be a 5 μm-thick gold film that only partially covers a predetermined area of the submount. In this case, the predetermined area is designed to approximately correspond to the area of the light sources. See FIG. 3A, FIG. 4C and FIG. 4D. More specifically, the thermal conductor may include a first thermal conductor 41 having a first thermal conductivity, a second thermal conductor 42 having a second thermal conductivity and a third thermal conductor 43 having a third thermal conductivity. For instance, the first thermal conductivity is at least one order of magnitude greater than the second thermal conductivity and the third thermal conductivity. Further, the first thermal conductor 41 may be a 5 μm-thick gold film, the second thermal conductor 42 may be an air, and the third thermal conductor 43 may by an epoxy resin. The third thermal conductor 43 may be arranged for supporting the portion of the output waveguide 19 of the photonic integrated circuit 100 because the output port 20 of the output waveguide 19 is connected to the optical fiber 60 and requires mechanical strength.

In some cases, the maximum transmittance wavelength of an interferometer can be positioned at a wavelength shorter than the operating wavelength $\lambda_o$ of a light source when the fabrication process variations caused wavelength variations of the interferometer. In this case, the operating wavelength $\lambda_o$ does not position in the predetermined range of wavelengths $\lambda_m \pm \Delta\lambda$, which also results in significant losses of the signal intensity while the signal beam propagates through the interferometer.

The thermal conductor 41 may include at least two portions to substantially include the operating wavelengths of the light sources 11 and 12 in the predetermined range of transmittance spectra of the first and second couplers 15 and 18.

In the examples discussed above, it is assumed that the first coupler 15 and the second coupler 18 are serially aligned along the width direction W on the substrate 10 from the light sources 11 and 12 to the output port 20, as illustrated in FIG. 4A. In such cases, it can be assumed that the average temperatures of the two waveguide arms of the interferometer are approximately the same, because the heat flowing from the light sources 11 and 12 to the third thermal conductor 43 equally raises temperatures of portions of the substrate 10, in which the portions are located at approximately the same distance from the light sources 11 and 12. For instance, see profile (b) in FIG. 3A, profiles (e) and (f) in FIG. 3C and FIG. 3B, the temperatures approximately decrease as a function of distance from the end of the first conductor to the third conductor.

In some cases, it is desirable to change the arrangement of the couplers 15 and 18 and waveguide arms 16 and 17 on the substrate 10 according to the designed layout of the photonic integrated circuit 100.

FIG. 6A shows a layout of the optical components 11-19 in the photonic integrated circuit 100, where the couplers 15 and 18 are arranged at approximately the same distance from the light sources 11 and 12 on the substrate 10. In this case, the waveguide arm 16 is nearly arranged to the light sources 11 and 12 compared to the waveguide arm 17.

By giving different temperatures to the two waveguide arms of the interferometer, the wavelength shift can be significantly increased. Let us define $L_1$ and $L_2$, $\beta_1$ and $\beta_2$, $T_1$ and $T_2$ as the length, propagation constant, and temperatures of the waveguide arms 1 and arm 2, respectively. The temperature $T_1$ may be an average temperature of the waveguide arm 16 throughout the arm length $L_1$, and the temperature $T_2$ may be an average temperature throughout the arm length $L_2$ of the waveguide arm 17.

The optical signal A after an ideal MZI can be expressed as, $$A=[\exp(j\beta_1 L_1)+\exp(j\beta_2 L_2)]/2.$$

Since the propagation constant $\beta$ can be expressed as $$\beta=2\pi n/\lambda,$$

where n is the effective refractive index, so in a linear approximation, $$\Delta\beta=2\pi\Delta n/\lambda.$$

The optical signal A depends on the relative phase of the two waveguide arms. If both waveguide arms have the same average temperature, the relative phase can be expressed as $$\Delta\beta(L_2-L_1),$$

since $\Delta\beta=\Delta\beta_1=\Delta\beta_2$. In other words, only the difference of the length affects the phase difference. However, if only the waveguide arm 1 has different temperature, then the relative phase difference is $\Delta\beta L_1$ and it now becomes much larger.

For example, $\Delta L=L_2-L1=50$ μm is needed if 4.5 nm wavelength separation is needed for the interferometer. If we choose $L_1=1000$ μm, and $L_2=950$ μm, then the wavelength shift becomes 20 times larger.

Figure 7:
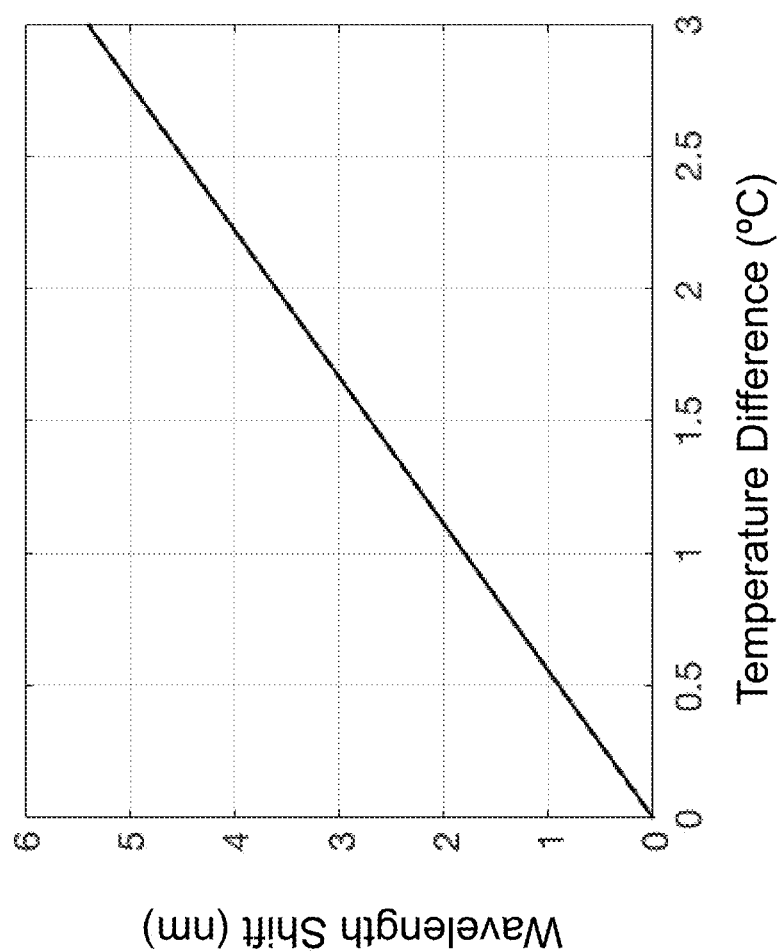
FIG. 7 shows the amounts of wavelength shift as a function of average temperature difference between a first waveguide arm and a second waveguide arm.

FIG. 7 shows the amounts of wavelength shift as a function of average temperature difference between a first waveguide arm and a second waveguide arm. The amount of wavelength shift approximately increases with the temperature difference between the waveguide arms. For instance, when a maximum transmittance wavelength of an interferometer (a coupler) is shorter than an operating wavelength of a light source by 1 nm in wavelength, the maximum transmittance wavelength can be matched to the operating wavelength of the light source by generating a temperature difference of 1° C. (1K) between the first waveguide arm 16 and the second waveguide arm 17. This amount of the temperature difference can be achieved by applying a layout of thermal conductors 41 and 43 based on FIG. 6B and FIGS. 3A-3C. For instance, when the center of the first waveguide arm 16 and the center of the second waveguide 17 are separated by 1 mm, a temperature difference of approximately 0.45° C. (0.45K) can be generated according to the arrangement (b) of FIG. 3A, and then the maximum transmittance wavelength can be adjusted toward longer wavelength by 1.8 nm. In other words, when the operating wavelength $\lambda_o$ of a light source is 1300 nm and the maximum transmittance wavelength $\lambda_m$ of an interferometer (coupler) is 1298.2 nm, the maximum transmittance wavelength of the interferometer can be adjusted to 1300 nm by generating the temperature difference of 1° C. using the layout of the thermal conductors of the submount of FIG. 6B.

According to embodiments of the present disclosure, the temperature ranges are designed so that the peak wavelengths of transmittance temperature spectra of the first and second couplers 15 and 18 are approximately matched in a designed range of wavelengths.

The thermal conductor 41 is disposed on the submount 40 so that the operating wavelengths of the first and second light sources 11 and 12 are in a predetermined wavelength range of transmittance of the first and second couplers (interferometers) 15 and 18 are set in a preset range of wavelengths.

Some embodiments of the present disclosure are recognition of the fact that the operation wavelengths of the light sources 11 and 12 vary due to heat generated from the light sources during the operations and the peak wavelength of transmittance is varied according to the heat conducting from the light sources 11 and 12. The thermal conductor 41 can be formed by different thermal conducting materials. Further, the thermal conductors 41 and 42 patterned on the submount may be Au/Sn thin film, Cu plating, aluminum nitride, or gold composite alloys.

Figure 8:
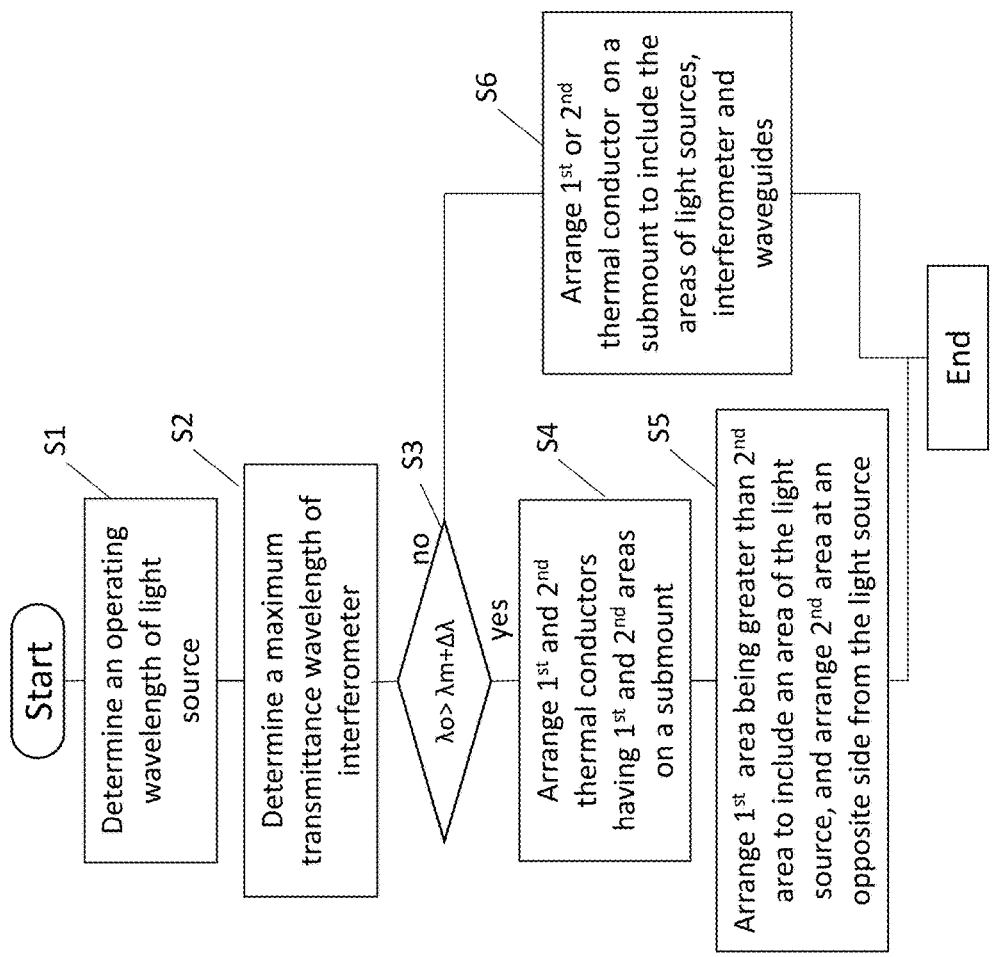
FIG. 8 is a flowchart indicating steps of a method for adjusting a maximum transmittance wavelength of an interferometer with an operating wavelength of a light source in a photonic integrated circuit disposed on a submount having thermal conductors.

FIG. 8 shows a flowchart indicating steps of a method for adjusting a maximum transmittance wavelength of an interferometer with an operating wavelength of a light source in a photonic integrated circuit disposed on a submount having thermal conductors. Although the steps are described for one light source, this method can be applied to two light sources and an interferometer having asymmetric waveguides (waveguide arms) of a photonic integration circuit.

The operating wavelengths of light sources are determined by optical measurements in step S1. The operating wavelength of a light source is determined in step S2 based on the geometric sizes of waveguides and an interferometer measured after the fabrication process of the photonic integrated circuit. When the operating wavelength $\lambda_o$ is greater than a maximum acceptable wavelength $\lambda_m+\Delta\lambda$ in step S3, an arrangement of first and second thermal conductors respectively having a first area and a second area is performed for the submount to be connected with the bottom of the substrate of the photonic integrated circuit. In this case, it is arranged in step S5 such that the first area includes an area of the light source(s) and is greater than the second area, and the second area is at an opposite end from the light source. When the operating wavelength $\lambda_o$ is in an acceptable range of wavelengths $\lambda_m\pm\Delta\lambda$ in step S3, the first thermal conductor or the second thermal conductor is arranged to include the area of the light source(s), the interferometer and the waveguides in the photonic integrated circuit in step S6.

In some cases, when the operating wavelength $\lambda_o$ is shorter than the minimum acceptable wavelength $\lambda_m-\Delta\lambda$, the first area may be arranged to be smaller than the second area so that a thermal resistance (thermal contact resistance) of the first thermal conductor is smaller than that of the second thermal conductor. This would cause that the heat generated by the light source(s) is more accumulated at the portion of the light source(s) than the portion of the second thermal conductor on the submount. As the submount is actively cooled down with a cooling device, such as a peltier device, the temperature of the portion of the second thermal conductor can be efficiently dropped while the portion of the first thermal conductor corresponding to the light source(s) is not dropped because the thermal resistance of the first thermal conductor is smaller than that of the second thermal conductor. This thermal resistance balance between the first and second thermal conductors can make the operating wavelength $\lambda_o$ become greater (longer) and the minimum acceptable wavelength $\lambda_m$-$\Delta\lambda$ become shorter, which reduces the amount of $\lambda_m$-$\lambda_o$ and can be applied for matching the operating wavelength $\lambda_o$ and the maximum transmittance wavelength $\lambda_m$.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments. Further, use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

We claim:

1. A photonic integrated circuit disposed on a substrate, comprising:
    first and second light sources to transmit a first light beam and a second light beam via first and second waveguides;
    an interferometer to combine the first and second light beams from the first and second waveguides and transmit a combined signal light beam from an output port of a combined waveguide, wherein the interferometer includes a first coupler, a second coupler and first and second signal waveguides connecting between the first and second couplers;
    a contact layer formed on a backside of the substrate; and
    a submount to contact the contact layer, wherein the submount includes a first thermal conductor corresponding to regions of the first and second light sources, a second thermal conductor corresponding to a region of the interferometer and a third thermal conductor corresponding to a part of the combined waveguide, wherein a temperature gradient of the substrate is defined by a heat flow from a region of the first and second light sources to the third thermal conductor, wherein the first signal waveguide and the second signal waveguide are substantially aligned along the temperature gradient.

2. The photonic integrated circuit of claim 1, further comprising:
    a heatsink including a thermoelectric cooling device to contact the submount.

3. The photonic integrated circuit of claim 1, wherein the contact layer is formed to partly cover the backside of the substrate and arranged to substantially overlap the regions of the first and second light sources.

4. The photonic integrated circuit of claim 1, wherein the first and second couplers are disposed at substantially equal distances from the first and second light sources and the first and second waveguides have different lengths, wherein intermediate curved regions of the first and second signal waveguides are separated by at least more than 500 μm.

5. The photonic integrated circuit of claim 1, wherein the submount has a groove region.

6. The photonic integrated circuit of claim 1, wherein the first thermal conductor has a first thermal conductivity, the second thermal conductor has a second thermal conductivity, and the third thermal conductor has a third thermal conductivity, wherein each of the first and third thermal conductivities is greater than the second thermal conductivity.

7. The photonic integrated circuit of claim 6, wherein the third thermal conductivity is at least one order of magnitude greater than the second thermal conductivity.

8. The photonic integrated circuit of claim 1, wherein a material of the third thermal conductor is the same as a material of the first thermal conductor.

9. The photonic integrated circuit of claim 1, wherein materials of the first and third thermal conductors are gold.

10. The photonic integrated circuit of claim 1, wherein the second thermal conductor is an air.

11. The photonic integrated circuit of claim 1, wherein the first thermal conductor substantially overlaps the regions of the first and second light sources.

12. The photonic integrated circuit of claim 1, wherein an area of the first thermal conductor is greater than an area of the third thermal conductor.

13. The photonic integrated circuit of claim 1, wherein the interferometer is a Mach-Zehnder interferometer.

14. The photonic integrated circuit of claim 1, wherein the first and second light sources are laser diodes.

15. The photonic integrated circuit of claim 1, wherein the first thermal conductor is gold or gold composite alloy and the second thermal conductor is indium phosphide.

16. The photonic integrated circuit of claim 1, wherein a material of the substrate is different from those of the first, second light sources and interferometer.

17. The photonic integrated circuit of claim 1, wherein the first and second light sources and the interferometer are formed on an indium phosphide substrate.

* * * * *